(12) United States Patent
Kim et al.

(10) Patent No.: US 7,521,763 B2
(45) Date of Patent: Apr. 21, 2009

(54) DUAL STRESS STI

(75) Inventors: Deok-kee Kim, Bedford Hills, NY (US); Seong-Dong Kim, LaGrangeville, NY (US); Oh-Jung Kwon, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 42 days.

(21) Appl. No.: 11/619,357

(22) Filed: Jan. 3, 2007

(65) Prior Publication Data
US 2008/0157216 A1 Jul. 3, 2008

(51) Int. Cl.
| | |
|---|---|
| H01L 29/76 | (2006.01) |
| H01L 29/94 | (2006.01) |
| H01L 31/062 | (2006.01) |
| H01L 31/113 | (2006.01) |
| H01L 31/119 | (2006.01) |
| H01L 31/00 | (2006.01) |
| H01L 29/00 | (2006.01) |
| H01L 23/34 | (2006.01) |

(52) U.S. Cl. .................. 257/374; 257/446; 257/501; 257/506; 257/510; 257/519; 257/520; 257/521; 257/725; 257/908; 257/E21.54; 257/E21.546; 257/E21.628; 257/E21.642

(58) Field of Classification Search .............. 257/374, 257/446, 501, 506, 510, 513–515, 519–521, 257/725, 908, E21.54, E21.546, E21.628, 257/E21.642
See application file for complete search history.

(56) References Cited

U.S. PATENT DOCUMENTS

| | | | |
|---|---|---|---|
| 6,329,681 B1 * | 12/2001 | Nakamura et al. | 257/297 |
| 6,621,110 B1 * | 9/2003 | Matsuoka et al. | 257/296 |
| 6,791,155 B1 | 9/2004 | Lo et al. | |
| 6,943,391 B2 | 9/2005 | Chi et al. | |
| 7,211,480 B2 * | 5/2007 | Inoue et al. | 438/221 |
| 7,384,851 B2 * | 6/2008 | Ieong et al. | 438/283 |
| 2001/0045589 A1 * | 11/2001 | Takeda et al. | 257/297 |
| 2002/0137275 A1 * | 9/2002 | Chien et al. | 438/241 |
| 2004/0113174 A1 | 6/2004 | Chidambarrao et al. | |
| 2005/0156274 A1 * | 7/2005 | Yeo et al. | 257/510 |
| 2005/0260806 A1 | 11/2005 | Chang et al. | |

(Continued)

OTHER PUBLICATIONS

E. Leobandung, et al.—"High Performance 65 nm SOI Technology with Dual Stress Liner and Low Capacitance SRAM Cell"—2005 Symposium on VLSI Technology Digest of Technical Papers—pp. 126-127.

(Continued)

Primary Examiner—Ida M Soward
(74) Attorney, Agent, or Firm—Gibb I.P. Law Firm, LLC; Todd M. C. Li, Esq.

(57) ABSTRACT

The embodiments of the invention provide a device, method, etc. for a dual stress STI. A semiconductor device is provided having a substrate with a first transistor region and a second transistor region different than the first transistor region. The first transistor region includes a PFET; and, the second transistor region includes an NFET. Further, STI regions are provided in the substrate adjacent sides of and positioned between the first transistor region and the second transistor region, wherein the STI regions each include a compressive region, a compressive liner, a tensile region, and a tensile liner.

15 Claims, 8 Drawing Sheets

U.S. PATENT DOCUMENTS

| | | |
|---|---|---|
| 2006/0001104 A1* | 1/2006 | Ookura ................ 257/368 |
| 2006/0022242 A1* | 2/2006 | Sugatani et al. .......... 257/296 |
| 2006/0091475 A1* | 5/2006 | Fujii et al. ............. 257/374 |
| 2006/0121688 A1* | 6/2006 | Ko et al. ................ 438/439 |
| 2006/0255415 A1 | 11/2006 | Freeman et al. |
| 2006/0281245 A1* | 12/2006 | Okuno et al. ........... 438/221 |
| 2008/0150037 A1* | 6/2008 | Teo et al. ............... 257/374 |

OTHER PUBLICATIONS

H.S. Yang, et al.—Dual Stress Liner For High Performance Sub-45nm Gate Length SOI CMOS Manufacturing—2004 IEEE—IEDM 04-1075-IEDM 04-1077.

C.D. Sheraw. et al.—"Dual Stress Liner Enhancement in Hybrid Orientation Technology"—2005 Symposium on VLSI Technology Digest of Technical Papers—pp. 12-13.

* cited by examiner

DUAL STRESS STI

BACKGROUND

1. Field of the Invention

The embodiments of the invention provide a device, method, etc. for a dual stress shallow trench isolation (STI).

2. Description of the Related Art

Stress induction improves device performance. For example, more tensile stress improves the performance of n-type field effect transistors (NFETs). Additionally, more compressive stress improves the performance of p-type field effect transistors (PFETs).

SUMMARY

Embodiments of the invention provide a device, method, etc. for a dual stress STI. A semiconductor device is provided having a substrate with a first transistor region and a second transistor region different than the first transistor region. The first transistor region can comprise a p-type field effect transistor (PFET); and, the second transistor region can comprise an n-type field effect transistor (NFET). Further, STI regions are provided in the substrate adjacent sides of and positioned between the first transistor region and the second transistor region, wherein the STI regions each comprise a compressive region, a compressive liner, a tensile region, and a tensile liner.

More specifically, the compressive region and the compressive liner are proximate the first transistor region; and, the tensile region and the tensile liner are proximate the second transistor region. The compressive region and the compressive liner are adapted to generate stress in a channel region of the PFET; and, the tensile region and the tensile liner are adapted to generate stress in a channel region of the NFET. Moreover, the compressive region contacts the compressive liner; and, the tensile region contacts the tensile liner and the compressive region, wherein a portion of the tensile region overlies a portion of the compressive region.

A method is also provided, comprising depositing an oxide layer and a nitride layer on a substrate. Next, the oxide layer, the nitride layer, and the substrate are patterned to form a first transistor region and a second transistor region within the substrate. The method then deposits a first compressive layer above the first transistor region, a second compressive layer above the first compressive layer, and a first tensile layer above the second transistor region. Furthermore, a second tensile layer is deposited above the first tensile layer.

Following this, the method polishes the second compressive layer, the second tensile layer, the first compressive layer, and the first tensile layer so as to form STI regions each comprising a compressive region, a compressive liner, a tensile region, and a tensile liner, adjacent sides of and positioned between the first transistor region and the second transistor region.

More specifically, the depositing of the first and second compressive layers includes depositing the first and second compressive layers so as to form the compressive liner and the compressive region, respectively, proximate the first transistor region. Moreover, the depositing of the first and second tensile layers includes depositing the first and second tensile layers so as to form the tensile liner and the tensile region, respectively, proximate the second transistor region. Additionally, the depositing of the first compressive layer includes depositing the first compressive layer so as to form the compressive liner such that the compressive liner contacts the first transistor region and the substrate. The depositing of the first tensile layer includes depositing the first tensile layer so as to form the tensile liner such that the tensile liner contacts the second transistor region, the substrate, and the compressive liner. Further, the depositing of the second compressive layer includes depositing the second compressive layer so as to form the compressive region such that the compressive region contacts the compressive liner. The depositing of the second tensile layer includes depositing the second tensile layer so as to form the tensile region such that the tensile region contacts the tensile liner and the compressive region.

In addition, the compressive region and the compressive liner are adapted to generate stress in a first channel region of the first transistor region; and, the tensile region and the tensile liner are adapted to generate stress in a second channel region of the second transistor region. Moreover, the method could include, prior to the polishing, depositing a neutral layer above the second tensile layer. Thus, the polishing could be performed so as to polish the neutral layer so as to form the STI regions each comprising a neutral region.

Accordingly, the embodiments of the invention provide additional stress induction to improve device performance by providing more compressive stress for PFETs and more tensile stress for NFETs. Stress is controlled in the PFET and NFET channel regions separately by controlling stress in the STI regions. This involves a dual stress STI nitride liner and a dual stress STI oxide liner. The embodiments herein are compatible and can be combined with prior FET improvement methods.

These and other aspects of the embodiments of the invention will be better appreciated and understood when considered in conjunction with the following description and the accompanying drawings. It should be understood, however, that the following descriptions, while indicating preferred embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which.

DETAILED DESCRIPTION OF PREFERRED EMBODIMENTS

Figure 1:
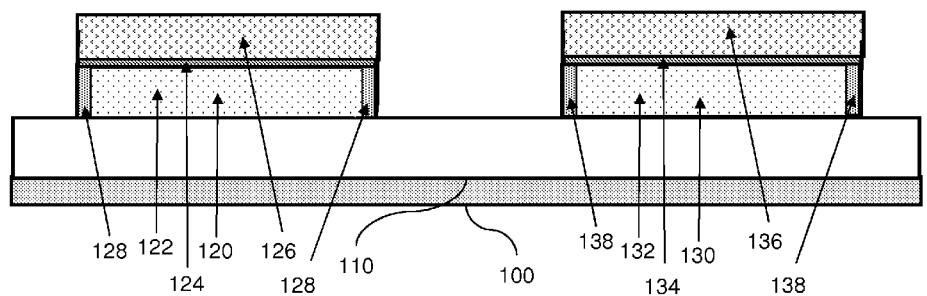
FIG. 1 is a diagram illustrating a PFET region and an NFET region.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

The embodiments of the invention provide additional stress induction to improve device performance by providing more compressive stress for PFETs and more tensile stress for NFETs. Stress is controlled in the PFET and NFET channel regions separately by controlling stress in the STI regions. This involves a dual stress STI nitride liner and a dual stress STI oxide liner. The embodiments herein are compatible and can be combined with prior FET improvement methods.

Many of the details of forming STI regions, tensile regions, compressive regions, oxides, nitrides, etching, patterning, polishing, etc., are well-known and are not discussed herein in detail so as to focus the reader on the salient portions of the invention. Instead, reference is made to U.S. Patent Publications 20040113174 to Chidambarrao et al. and 20060255415 to Freeman et al. for the description of such details and the same are fully incorporated herein by reference.

Referring now to FIG. 1, the process steps are shown in a silicon on insulator (SOI) wafer, although it is recognized that a bulk silicon wafer could be utilized. A buried oxide (BOX) layer 110 is on a silicon layer 100; and, SOI layers 122 and 132 (also referred to herein as silicon components) are on the BOX layer 110.

FIG. 1 shows a cross sectional schematic after an STI etch. Pad oxide and pad nitride are deposited on the SOI layers 122 and 132. STI is patterned and etched. Then, STI liner oxide is formed on the sides of SOI. At least one PFET region 120 (also referred to herein as the "first transistor region") is patterned on the BOX layer 110, wherein the PFET region 120 comprises a pad oxide 124 on the silicon component 122. A pad nitride 126 is provided on the pad oxide 124, wherein the pad nitride 126 could comprise silicon nitride ($Si_3N_4$). STI liner oxides 128 are also on sidewalls of the silicon component 122, wherein a height of a STI liner oxide 128 is approximately equal to a height of the silicon component 122.

Simultaneously with, or separately from the foregoing, at least one NFET region 130 (also referred to herein as the "second transistor region") is patterned on the BOX layer 110, wherein the NFET region 130 comprises a silicon component 132 and a pad oxide 134 on the silicon component 132. A pad nitride 136 is provided on the pad oxide 134, wherein the pad nitride 136 could comprise $Si_3N_4$. STI liner oxides 138 are also formed on sidewalls of the silicon component 132, wherein a height of a STI liner oxide 138 is approximately equal to a height of the silicon component 132.

Figure 2:
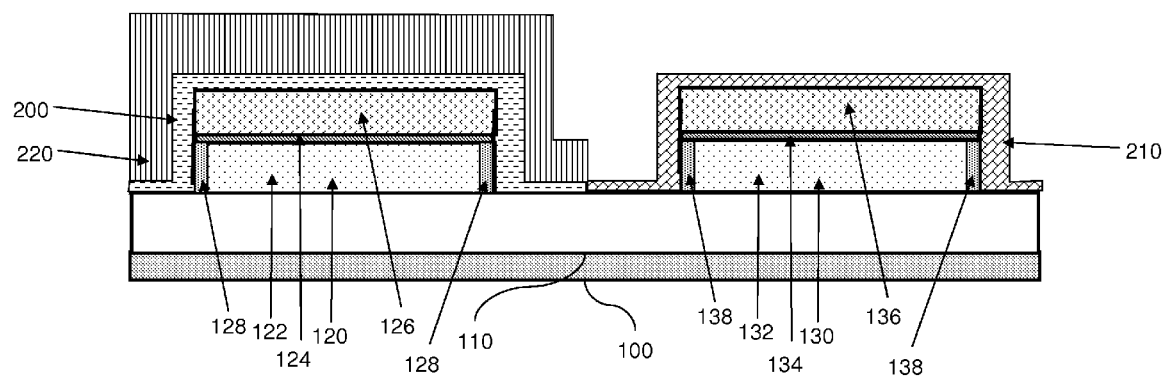
FIG. 2 is a diagram illustrating tensile and compressive liners and a compressive layer.

The process steps for FIG. 2 are as follows: deposit a compressive nitride liner 200 and a compressive oxide layer 220 everywhere. Using lithography and etching process, the compressive oxide and nitride layers are removed from the NFET region 130. Tensile nitride liner 210 is deposited everywhere. Using lithography and etching process, the tensile nitride liner is removed from the PFET region 120.

In other words, the compressive liner 200 (also referred to herein as the "first compressive layer") is formed on the PFET region 120 (i.e., outer sidewalls and a top surface of the STI liner oxides 128 and a top surface of the pad nitride 126) and on top surfaces of the BOX layer 110 that are adjacent the PFET region 120. Moreover, a tensile liner 210 (also referred to herein as the "first tensile layer") is formed on the NFET region 130 (i.e., outer sidewalls and a top surface of the STI liner oxides 138 and a top surface of the pad nitride 136) and on top surfaces of the BOX layer 110 that are adjacent the NFET region 130. The compressive liner 200 and the tensile liner 210 could be formed from nitride, for example. Additionally, a compressive layer 220 (also referred to herein as the "second compressive layer") is formed on the compressive liner 200, wherein the compressive layer 220 could be formed from oxide.

Figure 3:
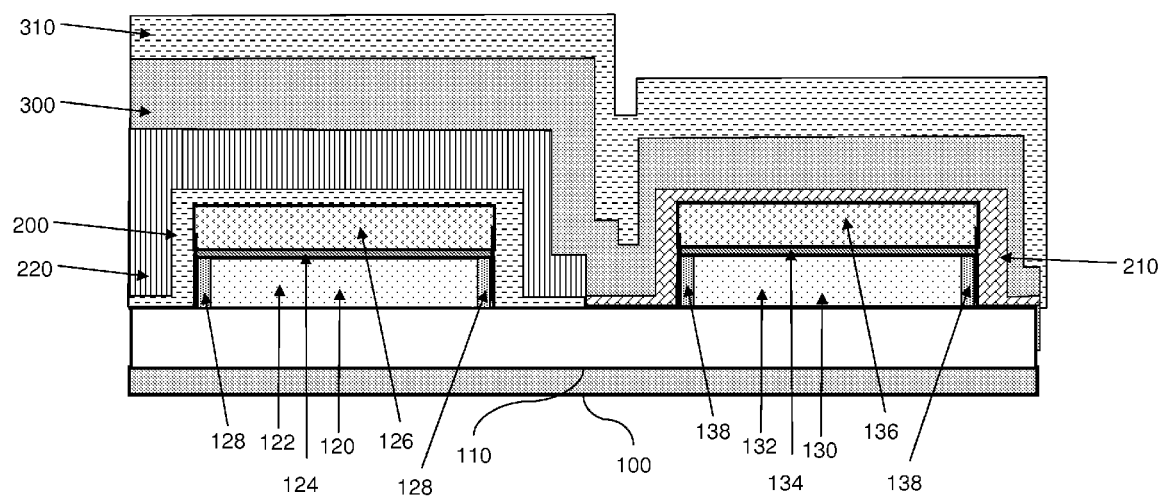
FIG. 3 is a diagram illustrating a tensile layer.

Following this, as illustrated in FIG. 3, a tensile layer 300 (also referred to herein as the "second tensile layer") is formed on the compressive layer 220 and the tensile liner 210, wherein the tensile layer 300 could be formed from oxide. Optionally, a neutral oxide layer 310 can be formed on the tensile layer 300.

Figure 4A:
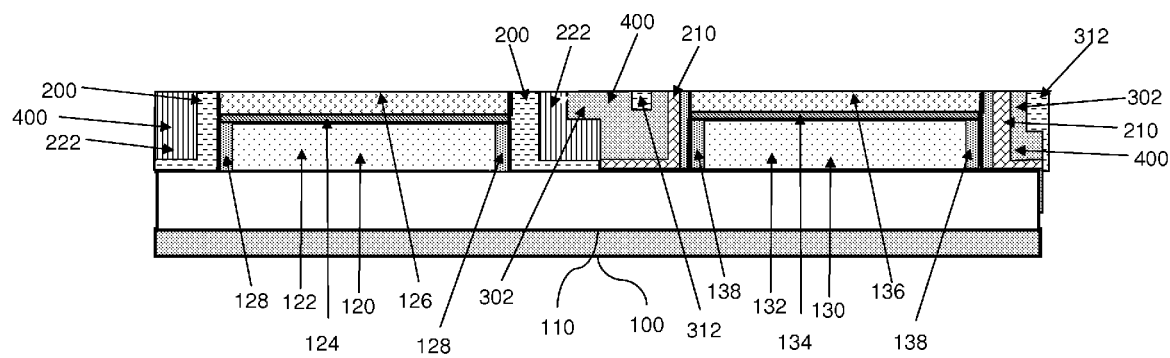
FIG. 4A is a diagram illustrating an STI region having neutral oxide.

A chemical mechanical polishing (CMP) process is subsequently performed to remove portions of the neutral oxide layer 310, the tensile layer 300, and the compressive layer 220 that are above the top surfaces of the pad nitrides 126 and 136 as shown in FIG. 4A. Moreover, the CMP process removes portions of the compressive liner 200 and the tensile liner 210 that are above the top surfaces of the pad nitrides 126 and 136.

Thus, STI regions 400 are formed between the PFET region(s) 120 and the NFET region(s) 130. Specifically, as illustrated in FIG. 4A, the STI regions 400 include the compressive liner 200 and the tensile liner 210, wherein bottom surfaces of the compressive liners 200 and the tensile liners 210 are on the top surface of the BOX layer 110. Moreover, outer sidewalls of the compressive liners 200 are on outer sidewalls of the STI liner oxides 128 of the PFET region 120, wherein a height of a compressive liner 200 is approximately equal to a combined height of an STI liner oxide 128, the pad oxide 124, and the pad nitride 126. Lower inner sidewalls of the compressive liners 200 contact lower inner sidewalls of the tensile liners 210. Outer sidewalls of the tensile liners 210 are on outer sidewalls of the STI liner oxides 138 of the NFET region 130, wherein a height of a tensile liner 210 is approximately equal to a combined height of an STI liner oxide 138, the pad oxide 134, and the pad nitride 136. Compressive region (PFET region) 122 is surrounded by compressive nitride liner and compressive oxide whereas tensile region (NFET region) 132 is surrounded by tensile nitride liner and tensile oxide layer, which gives PFET region compressive stress and NFET region tensile stress.

This forms compressive regions 222 on the compressive liners 200, wherein upper top surfaces of the compressive regions 222 are colinear with upper top surfaces of the compressive liners 200. Outer sidewalls of the compressive regions 222 are on upper inner sidewalls of the compressive liners 200; and, lower inner sidewalls of the compressive regions 222 are colinear with the lower inner sidewalls of the compressive liner 200.

Figure 4B:
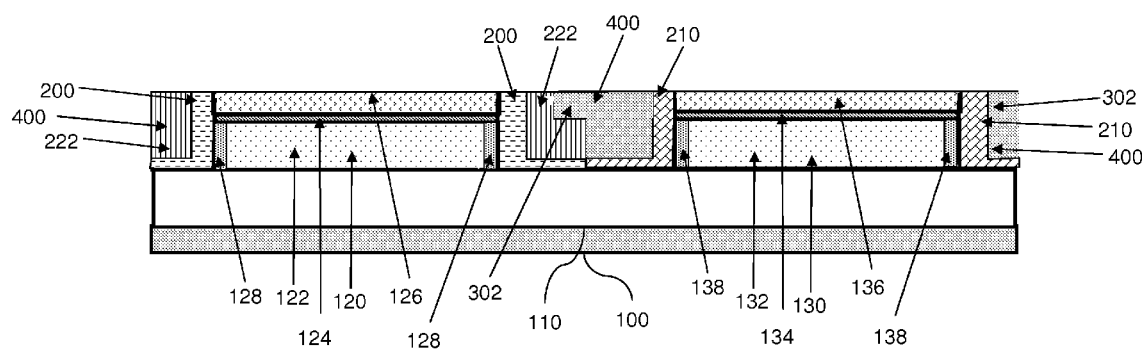
FIG. 4B is a diagram illustrating an STI region lacking neutral oxide.

This also forms tensile regions 302 on the tensile liners 210, wherein upper top surfaces of the tensile regions 302 are colinear with upper top surfaces of the tensile liners 210. Outer sidewalls of the tensile regions 302 are on upper inner sidewalls of the tensile liners 210. Moreover, lower inner sidewalls of the tensile regions 302 are colinear with the lower inner sidewalls of the tensile liner 210, wherein the lower inner sidewalls of the tensile regions 302 contact the lower inner sidewalls of the compressive regions 222. Upper inner sidewalls of the tensile regions 302 contact upper inner sidewalls of the compressive regions 222. Thus an upper inner portion of said tensile region overlies a lower inner portion of the compressive region. If the neutral oxide layer 310 is formed on the tensile layer 300, then neutral oxide regions 312 are formed in upper notches of the tensile regions 302. However, as illustrated in FIG. 4B, if the neutral oxide layer 310 is not formed, then the neutral oxide regions 312 are not formed and the tensile regions 302 lack upper notches.

Figure 5:
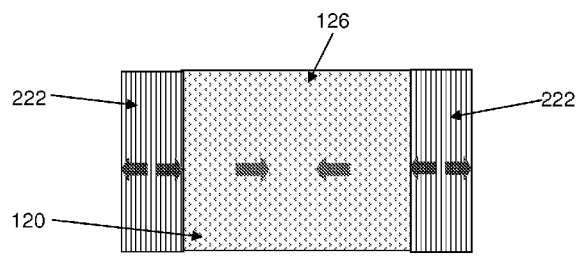
FIG. 5 is a diagram illustrating a top-down schematic of the PFET region.

Accordingly, the compressive liners 200 expand to produce compressive stress. This causes tensile stress in the silicon component 122 vertically and compressive stress in a channel of the PFET region 120 horizontally. Thus, the PFET region 120 performance is improved. The SOI layer 122 is under compressive stress due to Poisson contraction. As illustrated in FIG. 5, horizontal expansion of the compressive regions 222 causes compressive stress in the channel of the PFET region 120 horizontally.

The following are non-limiting examples. The embodiments are not limited to these examples and can be any size. The PFET region 120, the STI regions 400, and the NFET regions 130 could each be 120 nm wide in one example. The STI liner oxide 128 and the compressive liner 200 could each be 10 nm thick in one example. The distance between the outer sidewall and the upper inner sidewall of the compressive region 222 could be 30 nm in one example. The tensile region 302 could be 50 nm wide in one example.

Figure 6:
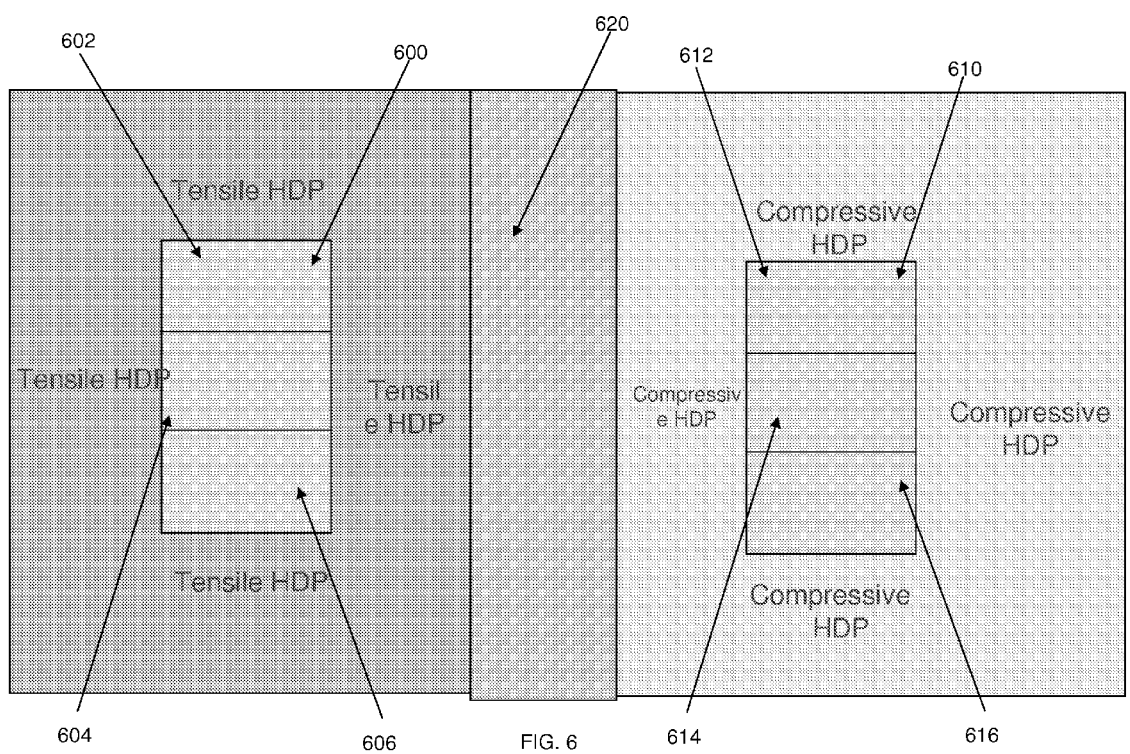
FIG. 6 is a diagram illustrating a top-down schematic of a PFET and an NFET.

FIG. 6 illustrates a top view of a structure formed according to the foregoing description having an NFET 600 having a source 602, a gate 604, and a drain 606; and, a PFET 610 having a source 612, a gate 614, and a drain 616. A neutral high density plasma (HDP) 620 is provided between the NFET 600 and the PFET 610. The NFET 600 comprises tensile HDP proximate (adjacent, next to, contacting, etc.) the source 602 and the drain 606. Tensile HDP is also proximate first and second sides of the gate 604, wherein the second side of the gate 604 is opposite the first side and proximate the neutral HDP 620. Similarly, the PFET 610 comprises compressive HDP proximate the source 612 and the drain 616. Compressive HDP is also proximate first and second sides of the gate 614, wherein the second side of the gate 614 is opposite the first side and proximate the neutral HDP 620.

Figure 7:
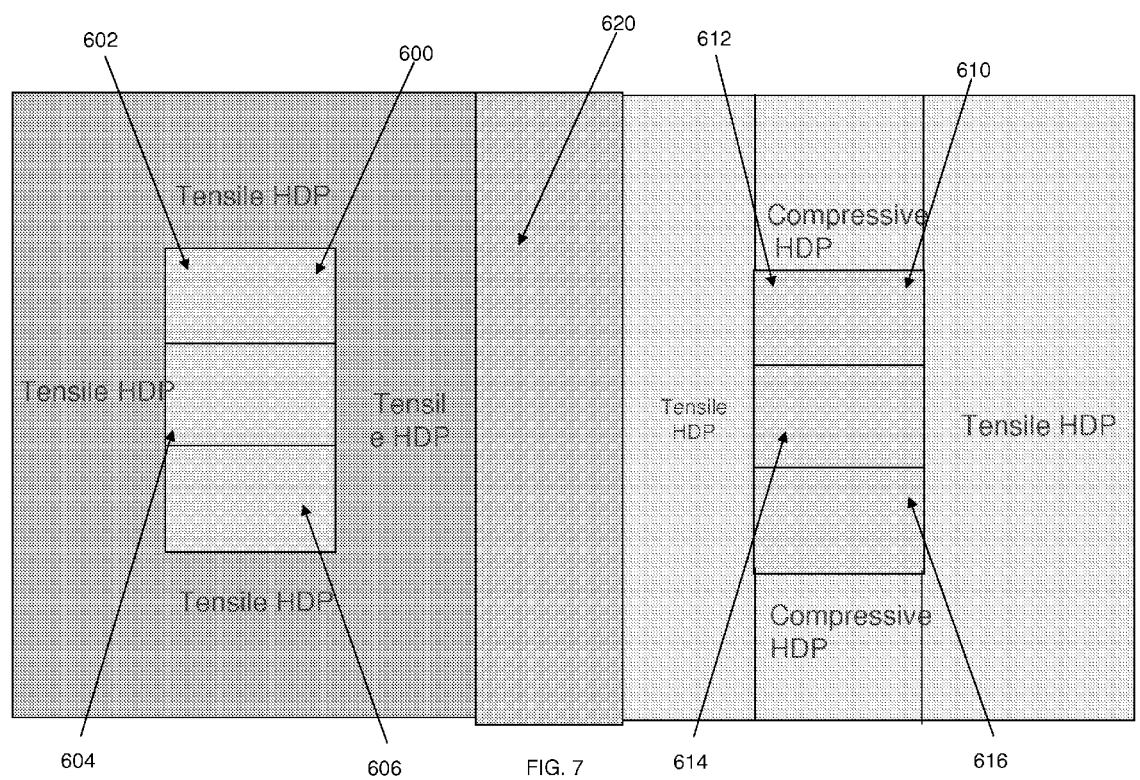
FIG. 7 is a diagram illustrating a top-down schematic of tensile HDP proximate the NFET.
Figure 8:
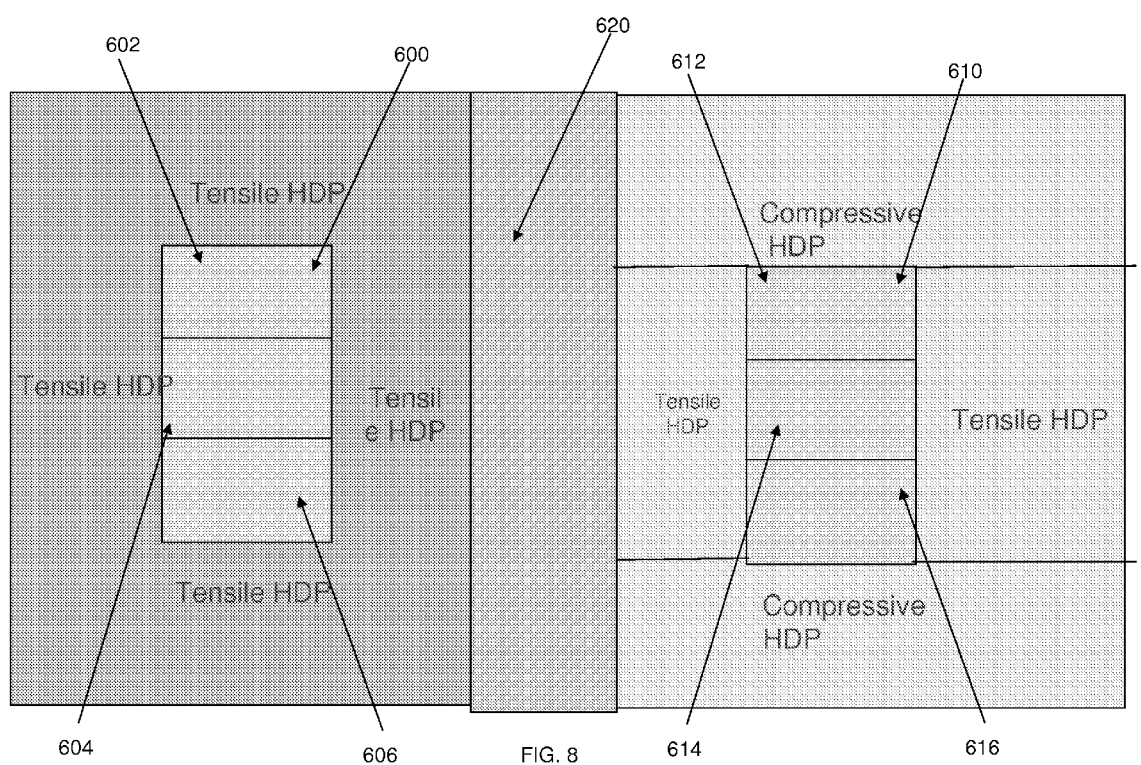
FIG. 8 is a diagram illustrating a top-down schematic of tensile HDP proximate the NFET, wherein the tensile HDP does not extend beyond outer edges of the NFET.

Alternatively, tensile HDP could be proximate the first and second sides of the gate 614. As illustrated in FIG. 7, the tensile HDP can extend beyond the source 612 and the drain 616. As illustrated in FIG. 8, however, the tensile HDP can extend only up to outer edges of the source 612 and the drain 616.

Accordingly, the embodiments of the invention provide a device, method, etc. for a dual stress STI. A semiconductor device is provided having a substrate with a first transistor region and a second transistor region different than the first transistor region. The first transistor region comprises a p-type field effect transistor (PFET); and, the second transistor region comprises an n-type field effect transistor (NFET). As described above, the first and second transistor regions each have a silicon component, a pad oxide, a pad nitride.

STI regions are provided in the substrate adjacent sides of and positioned between the first transistor region and the second transistor region, wherein the STI regions each comprise a compressive region, a compressive liner, a tensile region, and a tensile liner. As described above, the compressive and tensile liners each have a height that is approximately equal to a combined height of the STI liner oxide, the pad oxide, and the pad nitride.

Following the chemical mechanical polishing step shown in FIGS. 4A & 4B, the standard CMOS formation processes are performed. Pad nitride and pad oxide are stripped. Sacrificial oxide layer is grown and all the device implants are performed. After that, PC (poly conductor) layer is formed and additional device implants are performed. PFET's are formed in the compressive silicon region 120 and NFET's are formed in the tensile silicon region 130.

The compressive region and the compressive liner are proximate the first transistor region; and, the tensile region and the tensile liner are proximate the second transistor region. The compressive region and the compressive liner are adapted to generate stress in a channel region of the PFET; and, the tensile region and the tensile liner are adapted to generate stress in a channel region of the NFET. As described above, the embodiments herein provide additional stress induction to improve device performance by providing more compressive stress for PFETs and more tensile stress for NFETs.

Moreover, the compressive region contacts the compressive liner; and, the tensile region contacts the tensile liner and the compressive region, wherein a portion of the tensile region overlies a portion of the compressive region. As described above, the compressive liner and the tensile liner could be formed from nitride; and, the compressive region and the tensile region could be formed from oxide.

A method is also provided, comprising depositing an oxide layer and a nitride layer on an SOI substrate. Even though the drawings are for SOI wafers, it will be obvious to those in skill that bulk silicon wafers can be used instead of SOI wafers. The oxide layer, the nitride layer, and the substrate are patterned to form a first transistor region and a second transistor region within the substrate (above the BOX). As described above, the first and second transistor regions each have a silicon component, a pad oxide, a pad nitride. STI liner oxides are also provided on sidewalls of the silicon components, wherein a height of a STI liner oxide is approximately equal to a height of a silicon component.

The method then deposits a first compressive layer above the first transistor region and a second compressive layer above the first compressive layer. This involves depositing the first compressive layer everywhere, then the second compressive everywhere and etching the layers from the second transistor region with a block mask. A first tensile layer is deposited over the second transistor region. This involves depositing the first tensile layer everywhere and etching the layer from the first transistor region with a block mask. As described above, the first compressive layer and the first tensile layer are each formed on outer sidewalls and top surfaces of their respective STI liner oxides and top surfaces of their respective pad nitrides. Furthermore, a second tensile layer is deposited above the first tensile layer.

Following this, the method polishes the second compressive layer, the second tensile layer, the first compressive layer, and the first tensile layer so as to form STI regions each comprising a compressive region, a compressive liner, a tensile region, and a tensile liner, adjacent sides of and positioned between the first transistor region and the second transistor region. As described above, a CMP process is performed to remove portions of the first and second tensile layers, and the first and second compressive layers that are above the top surfaces of the pad nitrides.

More specifically, the depositing of the first and second compressive layers includes depositing the first and second compressive layers so as to form the compressive liner and the compressive region, respectively, proximate the first transistor region. Moreover, the depositing of the first and second tensile layers includes depositing the first and second tensile layers so as to form the tensile liner and the tensile region, respectively, proximate the second transistor region. The compressive region and the compressive liner are adapted to generate stress in a first channel region of the first transistor region; and, the tensile region and the tensile liner are adapted to generate stress in a second channel region of the second transistor region. Thus, as described above, the embodiments herein provide additional stress induction to improve device performance by providing more compressive stress for PFETs and more tensile stress for NFETs.

Additionally, the depositing of the first compressive layer includes depositing the first compressive layer so as to form the compressive liner such that the compressive liner contacts the first transistor region and the substrate. The depositing of the second compressive layer includes depositing the second compressive layer so as to form the compressive region such that the compressive region contacts the compressive liner. The depositing of the first tensile layer includes depositing the first tensile layer so as to form the tensile liner such that the tensile liner contacts the second transistor region, the substrate, and the compressive liner. Further, the depositing of the second tensile layer includes depositing the second tensile layer so as to form the tensile region such that the tensile region contacts the tensile liner and the compressive region. As described above, the compressive liner and the tensile liner could be formed from nitride; and, the compressive region and the tensile region could be formed from oxide.

Moreover, the method could include, prior to the polishing, depositing a neutral layer above the second tensile layer. Thus, the polishing could be performed so as to polish the neutral layer so as to form the STI regions each comprising a neutral region. As described above, if the neutral layer is formed on the second tensile layer, then neutral oxide regions are formed in upper notches of the tensile regions.

Figure 9:
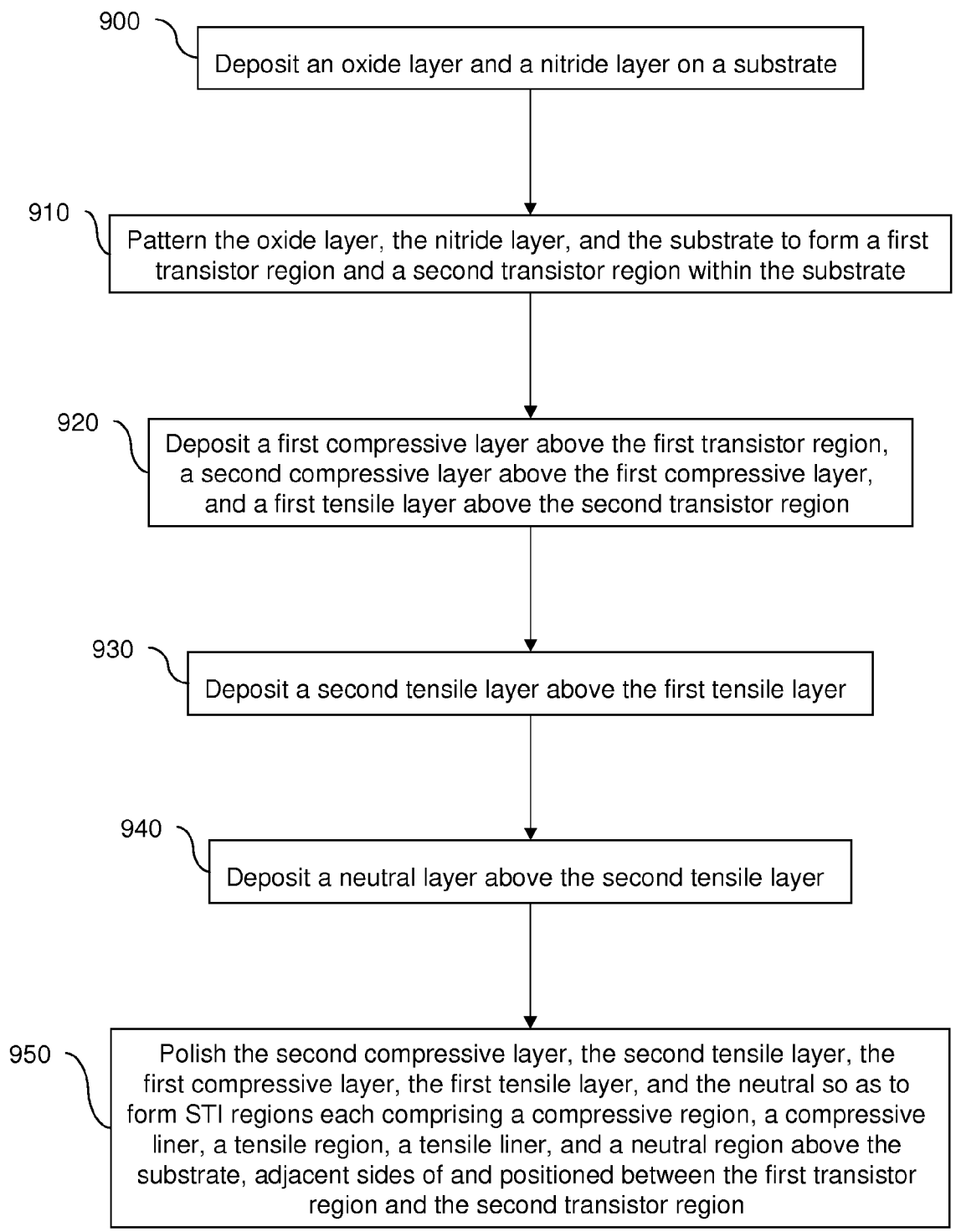
FIG. 9 is a flow diagram illustrating a method of forming a dual stress STI.

FIG. 9 is a flow diagram illustrating a method of forming a dual stress STI. The method begins in item 900 by depositing an oxide layer and a nitride layer on a substrate. The substrate could be either SOI or bulk silicon wafers. Next, in item 910, the oxide layer, the nitride layers, and the substrate are patterned to form a first transistor region and a second transistor region within the substrate. As described above, STI liner oxides are provided on sidewalls of silicon components, wherein a height of a STI liner oxide is approximately equal to a height of a silicon component.

In item 920, the method then deposits a first compressive layer above the first transistor region, a second compressive layer above the first compressive layer, and a first tensile layer above the second transistor region. As described above, the first compressive layer and the first tensile layer are each formed on outer sidewalls and top surfaces of their respective STI liner oxides and top surfaces of their respective pad nitrides. Furthermore, in item 930, a second tensile layer is deposited above the first tensile layer. Following this, in item 940, a neutral layer can be deposited above the second tensile layer. As described above, if the neutral layer is formed on the second tensile layer, then neutral oxide regions are subsequently formed in upper notches of the tensile regions.

Next, in item 950, the second compressive layer, the second tensile layer, the first compressive layer, the first tensile layer, and the neutral layer are polished so as to form STI regions each comprising a compressive region, a compressive liner, a tensile region, a tensile liner, and a neutral region, adjacent sides of and positioned between the first transistor region and the second transistor region. As described above, a CMP process is performed to remove portions of the first and second tensile layers, and the first and second compressive layers that are above the top surfaces of the pad nitrides.

Accordingly, the embodiments of the invention provide additional stress induction to improve device performance by providing more compressive stress for PFETs and more tensile stress for NFETs. Stress is controlled in the PFET and NFET channel regions separately by controlling stress in the STI regions. This involves a dual stress STI nitride liner and a dual stress STI oxide liner. The embodiments herein are compatible and can be combined with prior FET improvement methods.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

What is claimed is:

1. A semiconductor device, comprising:
   a substrate comprising:
      an insulator layer; and
      a semiconductor layer on said insulator layer, said semiconductor layer comprising: a first transistor region and a second transistor region different than said first transistor region; and
   a shallow trench isolation (STI) region extending through said semiconductor layer to said insulator layer such that a bottom surface of said shallow trench isolation region comprises said insulator layer,
   wherein said shallow trench isolation region is positioned laterally between a first side of said first transistor region and a second side of said second transistor region, and
   wherein said shallow trench isolation region region comprises a compressive region on said bottom surface and adjacent to said first side of said first transistor region and a tensile region on said bottom surface and adjacent to said second side of said second transistor region.

2. The device according to claim 1, wherein said first transistor region comprises a p-type field effect transistor (PFET), and wherein said second transistor region comprises an n-type field effect transistor (NFET).

3. The device according to claim 2, wherein said compressive region is adapted to generate stress in a channel region of said PFET, and wherein said tensile region is adapted to generate stress in a channel region of said NFET.

4. The device according to claim 1,
   wherein said compressive region comprises:
      a compressive nitride liner having a first vertical portion extending vertically from said insulator layer along said first side of said first transistor region and a first horizontal portion extending horizontally from said first vertical portion along said insulator layer towards said second transistor region; and
      a compressive oxide layer on said first horizontal portion and positioned laterally adjacent to said first vertical portion, and wherein said tensile region comprises:
  a tensile nitride liner having a second vertical portion extending vertically from said insulator layer along said second side of said second transistor region and a second horizontal portion extending horizontally from said second vertical portion along said insulator layer towards said first transistor region; and
  a tensile oxide layer on said second horizontal portion and positioned laterally adjacent to said second vertical portion.

5. The device according to claim 4, wherein a portion of said tensile layer overlies a portion of said compressive layer.

6. A semiconductor device, comprising:
a substrate comprising a first transistor region and a second transistor region different than said first transistor region; and
a shallow trench isolation (STI) region positioned laterally between said first transistor region and said second transistor region,
wherein said shallow trench isolation region comprises a compressive region adjacent to a first side of said first transistor region and a tensile region adjacent to a second side of said second transistor region,
wherein said compressive region comprises:
  a compressive liner having a first vertical portion extending vertically along said first side of said first transistor region and a first horizontal portion extending horizontally from said first vertical portion towards said second transistor region; and
  a compressive layer on said first horizontal portion and positioned laterally adjacent to said first vertical portion, and
wherein said tensile region comprises:
  a tensile liner having a second vertical portion extending vertically along said second side of said second transistor region and a second horizontal portion extending horizontally from said second vertical portion towards said first transistor region; and
  a tensile layer on said second horizontal portion and positioned laterally adjacent to said second vertical portion.

7. The device according to claim 6, wherein said first transistor region comprises a p-type field effect transistor (PFET), and wherein said second transistor region comprises an n-type field effect transistor (NFET).

8. The device according to claim 7, wherein said compressive region is adapted to generate stress in a channel region of said PFET, and wherein said tensile region is adapted to generate stress in a channel region of said NFET.

9. The device according to claim 6, wherein said compressive liner comprises a compressive nitride liner, said compressive layer comprises a compressive oxide layer, said tensile liner comprises a tensile nitride layer and said tensile layer comprises a tensile oxide layer.

10. The device according to claim 6, wherein a portion of said tensile layer overlies a portion of said compressive layer.

11. A semiconductor device, comprising:
a substrate comprising:
  an insulator layer;
  a semiconductor layer on said insulator layer, said semiconductor layer comprising: a first transistor region and a second transistor region different than said first transistor region; and
a shallow trench isolation (STI) region extending through said semiconductor layer to said insulator layer such that a bottom surface of said shallow trench isolation region comprises said insulator layer,
wherein said shallow trench isolation region is positioned laterally between a first side of said first transistor region and a second side of said second transistor region, and
wherein said shallow region comprises:
  a first oxide layer extending vertically from said bottom surface along said first side of said first transistor region;
  a compressive region on said bottom surface and adjacent to said first oxide layer;
  a tensile region on said bottom surface and adjacent to said compressive region; and
  a second oxide layer adjacent to said tensile region and extending vertically from said bottom surface along said second side of said second transistor region,
wherein said compressive region comprises:
  a compressive liner having a first vertical portion adjacent to said first oxide layer and a first horizontal portion extending horizontally from said first vertical portion towards said second transistor region; and
  a compressive layer on said first horizontal portion and positioned laterally adjacent to said first vertical portion, and
wherein said tensile region comprises:
  a tensile liner having a second vertical portion adjacent to said second oxide layer and a second horizontal portion extending horizontally from said second vertical portion towards said first transistor region; and
  a tensile layer on said second horizontal portion and positioned laterally adjacent to said second vertical portion.

12. The method according to claim 11, wherein said first transistor region comprises a p-type field effect transistor (PFET), and wherein said second transistor region comprises an n-type field effect transistor (NFET).

13. The device according to claim 12, wherein said compressive region is adapted to generate stress in a channel region of said PFET, and wherein said tensile region is adapted to generate stress in a channel region of said NFET.

14. The device according to claim 11, wherein said compressive liner comprises a compressive nitride liner, said compressive layer comprises a compressive oxide layer, said tensile liner comprises a tensile nitride layer and said tensile layer comprises a tensile oxide layer.

15. The device according to claim 11, wherein a portion of said tensile layer overlies a portion of said compressive layer.

* * * * *